(12) United States Patent
DeVarney

(10) Patent No.: US 9,247,649 B2
(45) Date of Patent: Jan. 26, 2016

(54) PRINTED CIRCUIT BOARDS FABRICATED USING CONGRUENT MOLDS

(71) Applicant: GLOBALFOUNDRIES INC., Grand Cayman (KY)

(72) Inventor: Craig N. DeVarney, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 112 days.

(21) Appl. No.: 13/887,807

(22) Filed: May 6, 2013

(65) Prior Publication Data

US 2014/0326483 A1    Nov. 6, 2014

(51) Int. Cl.
*H05K 3/00* (2006.01)
*H05K 3/04* (2006.01)

(52) U.S. Cl.
CPC ........ *H05K 3/045* (2013.01); *H05K 2201/0382* (2013.01); *H05K 2201/09036* (2013.01); *H05K 2203/025* (2013.01)

(58) Field of Classification Search
CPC ..... H05K 3/00; H05K 3/0014; H05K 3/0055; H05K 3/007; H05K 3/045; H05K 2201/0382; H05K 2203/025
See application file for complete search history.

(56) References Cited

U.S. PATENT DOCUMENTS

| | | | | |
|---|---|---|---|---|
| 3,547,724 A | * | 12/1970 | Zagusta | 156/233 |
| 3,847,700 A | * | 11/1974 | Dalal et al. | 156/252 |
| 3,932,253 A | * | 1/1976 | Elarde et al. | 156/249 |
| 4,106,187 A | | 8/1978 | Smith et al. | |
| 4,313,995 A | * | 2/1982 | Delgadillo | 428/201 |
| 4,510,008 A | | 4/1985 | Hoshi et al. | |
| 4,898,759 A | | 2/1990 | Hoover et al. | |
| 4,982,892 A | | 1/1991 | Parla et al. | |
| 4,996,391 A | | 2/1991 | Schmidt | |
| 5,010,641 A | | 4/1991 | Sisler | |
| 5,268,064 A | | 12/1993 | Woo et al. | |
| 5,325,583 A | * | 7/1994 | Shimizu et al. | 29/849 |
| 7,453,045 B2 | | 11/2008 | Myoung et al. | |
| 2003/0150101 A1 | | 8/2003 | Park et al. | |
| 2008/0016686 A1 | * | 1/2008 | Lee et al. | 29/846 |

FOREIGN PATENT DOCUMENTS

| | | |
|---|---|---|
| CN | 101631433 A | 1/2010 |
| CN | 202471763 U | 10/2012 |
| EP | 0198053 A1 | 10/1986 |
| EP | 206179 A2 | 12/1986 |
| JP | 2001257448 A | 9/2001 |
| JP | 3220794 B2 | 10/2001 |
| KR | 20070023319 A | 2/2007 |

* cited by examiner

*Primary Examiner* — Carl Arbes
(74) *Attorney, Agent, or Firm* — Thompson Hine LLP; Anthony J. Canale

(57) ABSTRACT

Methods for fabricating printed circuit boards, devices for use in the fabrication of printed circuit boards, and structures for a printed circuit board. A mold may be formed as a device that includes a plurality of features, such as recesses, corresponding to a layout of a plurality of conductors for the printed circuit board. A sheet comprised of an electrically-conductive material may be deformed to match the features of the mold. A substrate may then be added to support the sheet, and the sheet may be selectively removed with a mechanical process to define the conductors of the printed circuit board.

15 Claims, 7 Drawing Sheets

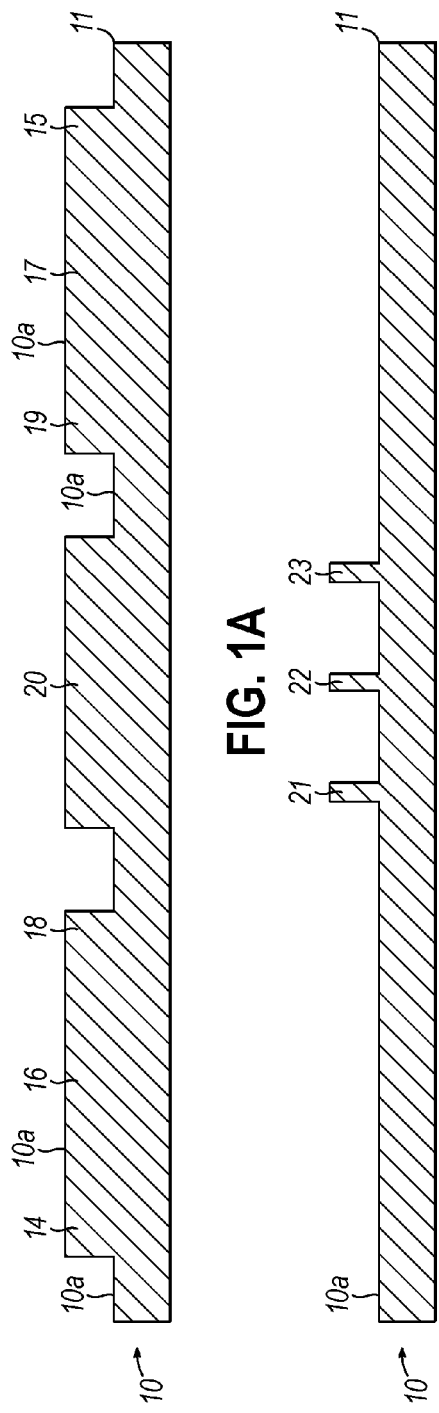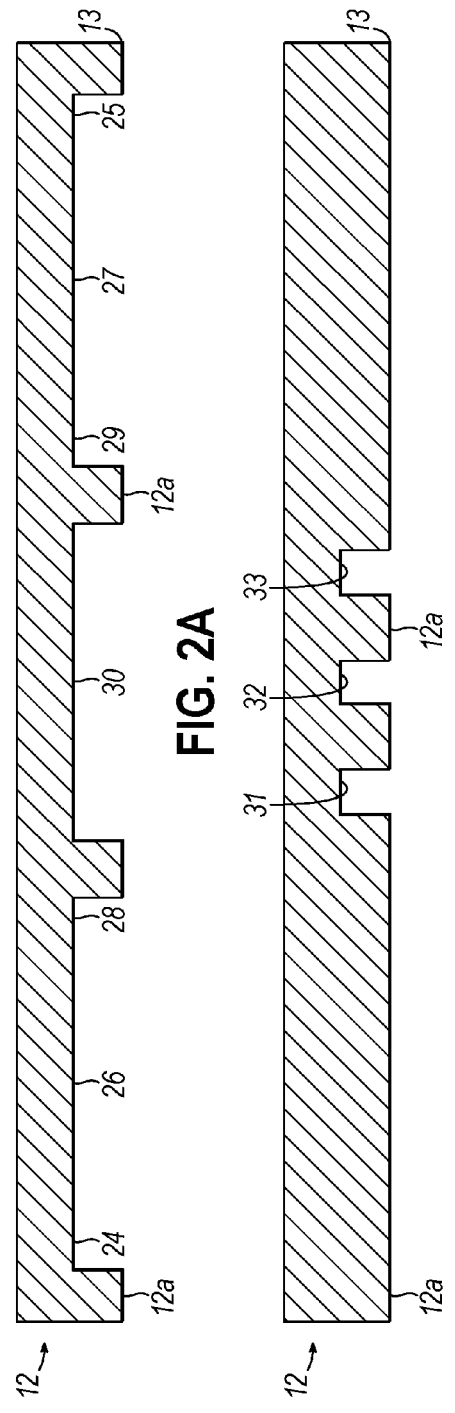

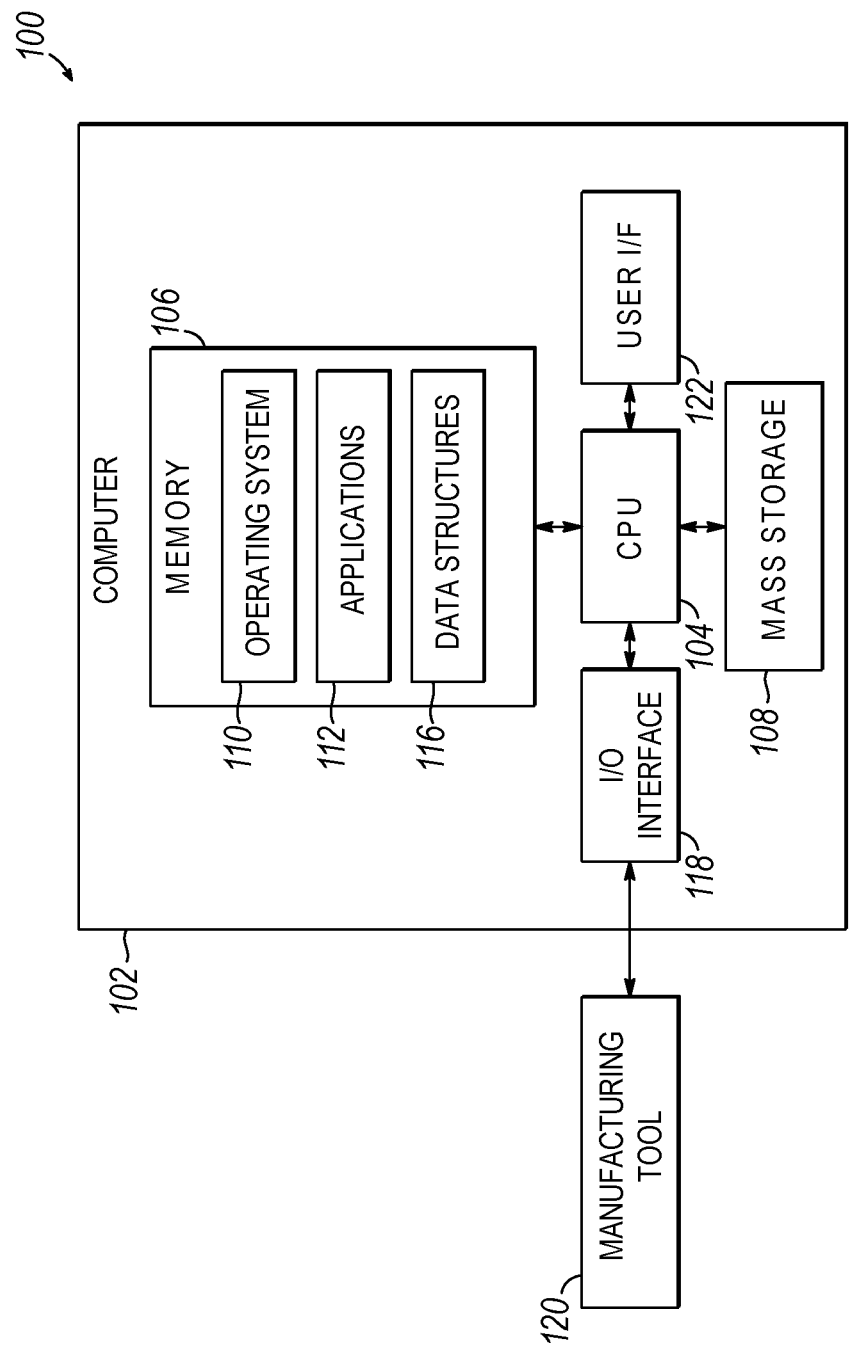

PRINTED CIRCUIT BOARDS FABRICATED USING CONGRUENT MOLDS

BACKGROUND

The invention relates generally to structural platforms for mechanically supporting and electrically connecting electronic components, and, in particular, to methods and devices for fabricating printed circuit boards and other structural platforms, and structures for a printed circuit board and other structural platforms.

A printed circuit board is used to provide the physical structure for mounting and supporting electronic components, as well as providing their electrical interconnections. The electronic components, which may include passive devices (resistor, inductor, capacitors, etc.) and active devices (operational amplifiers, transistors, digital components, etc.), are connected on the printed circuit board by conductors. The conductors may be etched from a conductive sheet laminated onto a non-conductive substrate or from a conductive layer deposited onto the non-conductive substrate and then patterned. A printed circuit board assembly consists of a printed circuit board and electronic components populating the printed circuit board.

Improved methods for fabricating printed circuit boards, improved devices for use in the fabrication of printed circuit boards, and improved structures for a printed circuit board are needed.

BRIEF SUMMARY

In an embodiment of the invention, a method is provided for fabricating a printed circuit board. The method includes obtaining a mold having a plurality of features corresponding to a layout of a plurality of conductors for the printed circuit board. The method includes deforming a sheet comprised of an electrically-conductive material to match the features of the mold.

In another embodiment of the invention, a method is provided for fabricating a printed circuit board having a substrate comprised of a dielectric material and a plurality of conductors. The method includes forming a mold including a plurality of features corresponding to a layout for the conductors of the printed circuit board.

In another embodiment of the invention, a printed circuit board includes a substrate comprised of a dielectric material and a plurality of conductors coupled with the substrate. The substrate includes a surface and a plurality of recesses in the surface. Each conductor is positioned in one of the recesses, and the conductors and the recesses are arranged in a layout of the conductors for the printed circuit board.

In another embodiment of the invention, a device is provided for use in fabricating a printed circuit board having a plurality of conductors on a substrate. The device includes a mold with a plurality of features corresponding to a layout for the conductors of the printed circuit board. The device may further include a second mold having a plurality of features corresponding in configuration, shape, and arrangement to the features of the first mold. The features of the first mold may comprise recesses, and the features of the second mold may comprise projections having a dimensional tolerance relative to the recesses.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1A is a cross-sectional view of the mold of FIG. 1 taken generally along line 1A-1A in FIG. 1.

FIG. 1B is a cross-sectional view of the mold of FIG. 1 taken generally along line 1B-1B in FIG. 1.

FIG. 2A is a cross-sectional view of the mold of FIG. 2 taken generally along line 2A-2A in FIG. 2.

FIG. 2B is a cross-sectional view of the mold of FIG. 2 taken generally along line 2B-2B in FIG. 2.

FIG. 8 is a top view of the printed circuit board in which FIG. 7 is taken generally along line 7-7.

FIG. 9 is a block diagram of an example implementation of a system for designing and producing the molds used to fabricate the printed circuit board.

DETAILED DESCRIPTION

Figure 1:
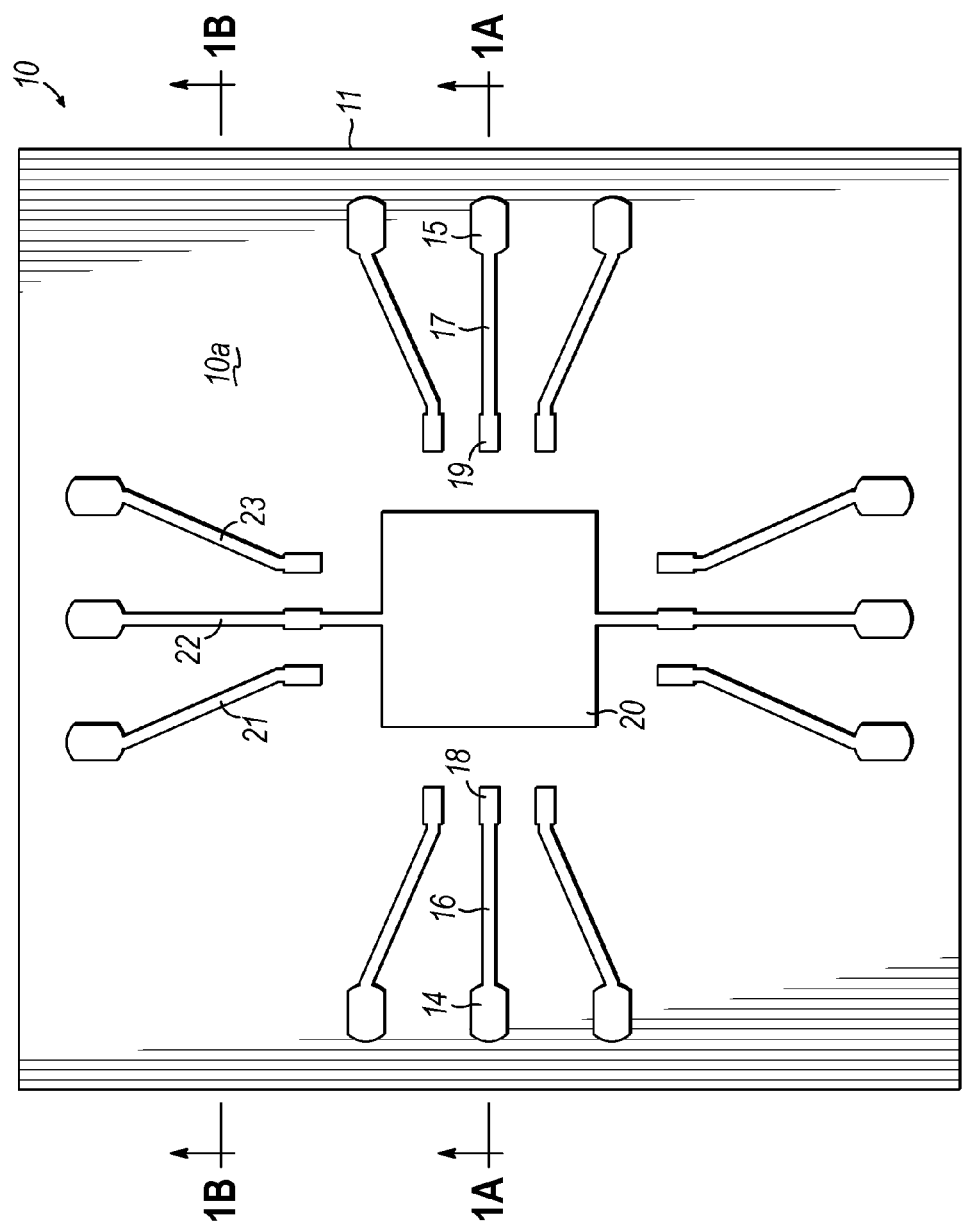
FIG. 1 is a top view of a mold for fabricating a printed circuit board in accordance with an embodiment of the invention.

With reference to FIGS. 1, 1A, 1B and FIGS. 2, 2A, 2B, a plurality of congruent molds 10, 12 are prepared as a mold set that may be used to manufacture a printed circuit board, or other related structure, for mechanically supporting and electrically connecting electronic components. The molds 10, 12 are congruent molds in which mold 10 may be characterized as a negative or female mold of the mold set and mold 12 may be characterized as a positive or male mold of the mold set if, for example, surface 10a has a greater surface area than surface 12a. The molds 10, 12 may be provided with vent openings (not shown) for the escape of trapped air to the external environment when the molds 10, 12 are pressed together.

Mold 10 (FIGS. 1, 1A, 1B) has a surface 10a, an outer edge or perimeter 11 surrounding the surface 10a, and a plurality of details or features, including the representative features 14-23. The features 14-23 may comprise indentations that are recessed relative to a flat or planar background defined by the surface 10a. The features 14-23 of mold 10 are configured, arranged, and shaped to be used to produce a desired circuit pattern of conductors for a printed circuit board. In particular, the features 14-23 may correspond to distinct conductors in the conductor pattern of the circuit for a printed circuit board. The conductors reflected in the features of mold 10 may comprise polygons or lands, solder pads, power tracks, signal tracks, or other objects found as conductors of a printed circuit board. In the embodiment of the mold 10 shown in FIG. 1, representative features 16, 17, and 21-23 correspond to tracks or traces in the conductor pattern, representative features 14, 15, 18, 19 correspond to solder pads in the conductor pattern, and representative feature 20 corresponds to a land in the conductor pattern. Traces may be used to carry signals or power, solder pads may be used as electrical connection sites, and lands may be used, for example, as solid conductor fill to furnish a ground plane for a component. Other features of similar shapes in FIG. 1 may represent features similar to features 14-23.

Mold 12 (FIGS. 2, 2A, 2B) has a surface 12a, an outer edge or perimeter 13 surrounding the surface 12a, and a plurality of details or features, including the representative features 24-33. The features 24-33 may comprise projections that are raised relative to a flat or planar background defined by the surface 12a. The features 24-33 of mold 12 are complementary in shape, configuration, and arrangement to the features 14-23 of mold 10 and may be dimensioned to respectively fit with a close dimensional tolerance into features 14-23. When complementary mold features are engaged during the use of the molds 10, 12, the surface 12a of mold 12 is located proximate to the surface 10a of mold 10.

Figure 2:
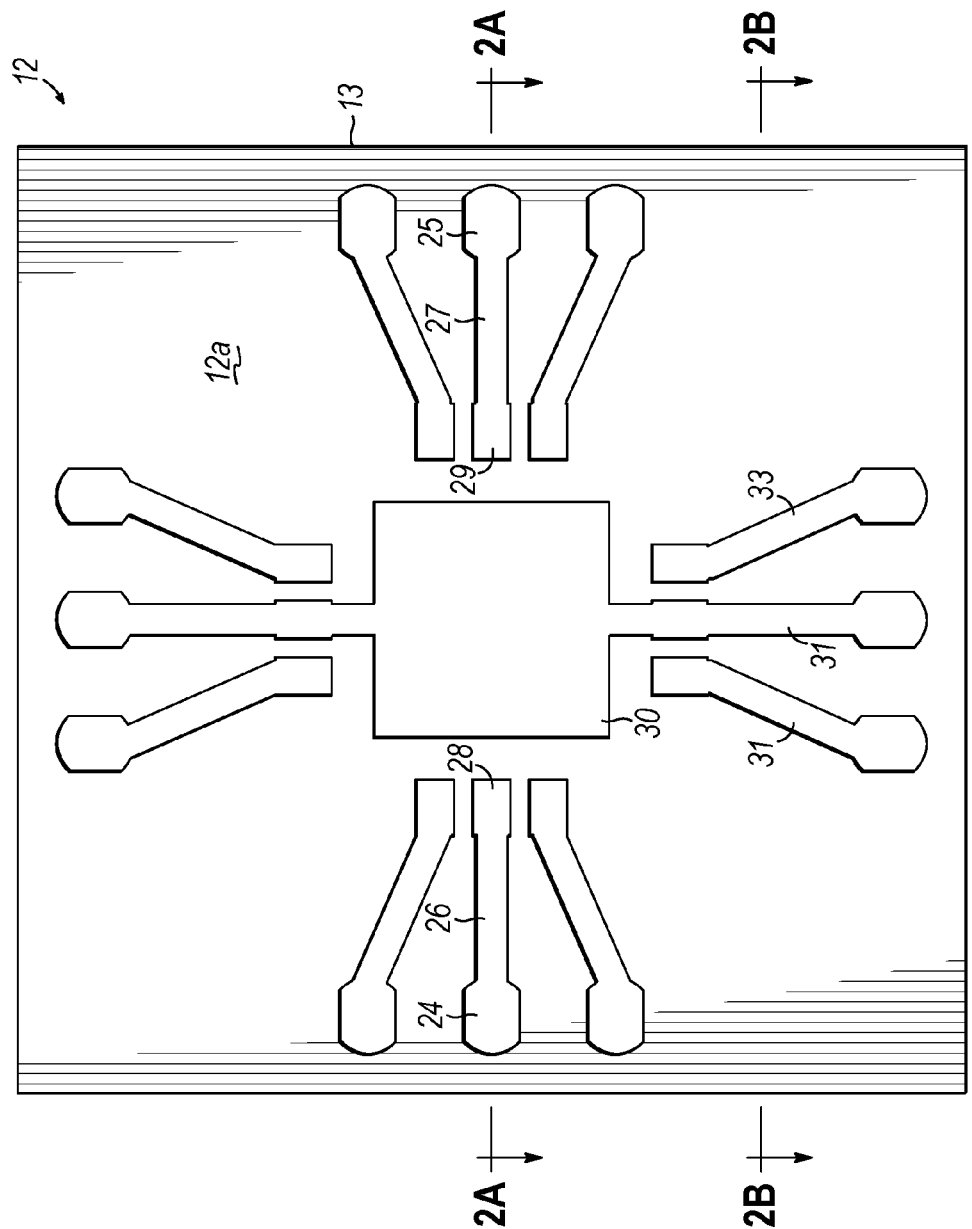
FIG. 2 is a top view of a mold congruent to the mold of FIG. 1 and used in conjunction with the mold of FIG. 1 to fabricate the printed circuit board.
Figure 3:
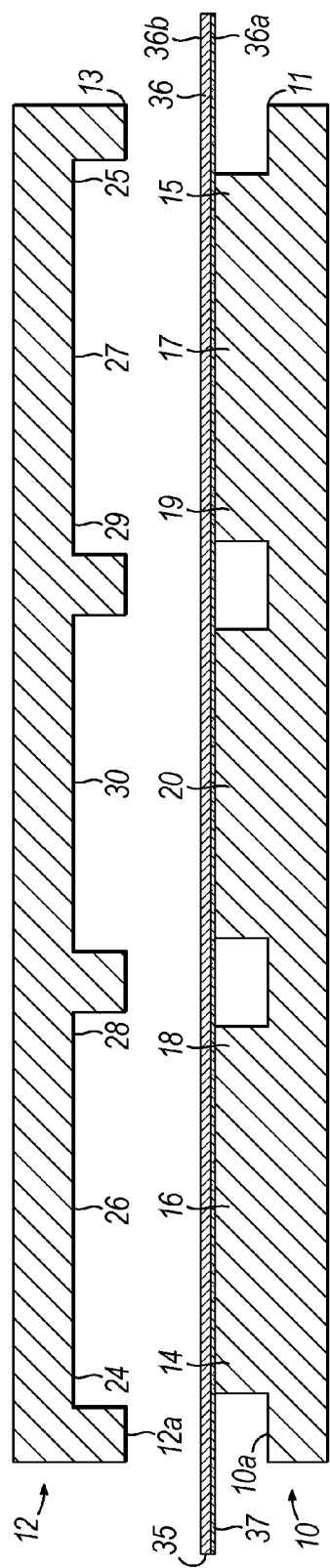
FIG. 3 is a cross-sectional view similar to FIG. 1 in which a sheet of an electrically-conductive material is associated with the mold.

With reference to FIG. 3 in which like reference numerals refer to like features in FIG. 2 and at a subsequent stage of the process flow, a layer or sheet 36 is placed in a contacting relationship with the surface 10a of the mold 10. The sheet 36, which may be flat or planar when placed on surface 10a, has surfaces 36a, 36b that extend parallel to a plane containing the surface 10a. In one embodiment, the outer perimeter 11 of the mold 10 is located inside of an outer perimeter 35 of the sheet 36. The sheet 36 overlies the features of mold 10. While features 14-20 of mold 10 are depicted for convenience of illustration in FIG. 3, it is understood that the sheet 36 may overlie all features of mold 10 including features of FIG. 1 that are not visible in FIG. 3.

After the sheet 36 is placed into mold 10, the features (e.g., features 24-30) of mold 12 are aligned in registration with the features (e.g., features 14-20) of mold 10. A dimensional tolerance of the features of mold 12 may be selected during the design phase to provide space for the sheet 36 between the features of mold 10 and the features of mold 12. In a representative embodiment, the height and width of the features of mold 12 may be smaller than the corresponding dimensions of features of mold 10 in proportion to the thickness, t, of the sheet 36.

The sheet 36 may be temporarily secured to mold 10 in a removable and releasable manner. In one embodiment, the surface 36a of sheet 36 may be bonded to mold 10 using, for example, a layer 37 of a weak or low-tack adhesive agent. The layer 37 may be pre-applied to the surface 36a of sheet 36. The surface 36b of sheet 36 opposite to surface 36a may be free of adhesive agent.

The sheet 36 may be a thin foil that is comprised of an electrically-conductive material. The electrically-conductive material may comprise a metal, such as copper, aluminum, or a metal alloy, that is characterized by a given purity (e.g., 99.9% pure), that may be annealed, and that may have a given surface finish. The thickness, t, of the sheet 36 is a factor determining the thickness of the conductors in the finished printed circuit board, and may be chosen by the designer during conductor layout. The sheet 36 may have a thickness, t, specified in units of length and the thickness of the sheet 36 may be constant over its area. For example, the thickness, t, of sheet 36 may be in a range from 1 mil (about 25 μm of thickness) to 10 mils (about 254 μm of thickness), or any other designated thickness that provides a desired feature thickness in the finished printed circuit board. Alternatively, the thickness, t, of the sheet 36 may be specified as weight of metal per unit area (e.g., ounces of copper per square foot in which instance each ounce of copper is approximately 1.4 mils (35 μm of thickness)). For conversion, thickness is given by the weight divided by the product of cross-sectional area and density. Thicker metal features may have a higher current-carrying capability that is suitable for use in power electronics boards (e.g., high power distribution, heat dissipation, planar transformers, and power convertors).

Figure 4:
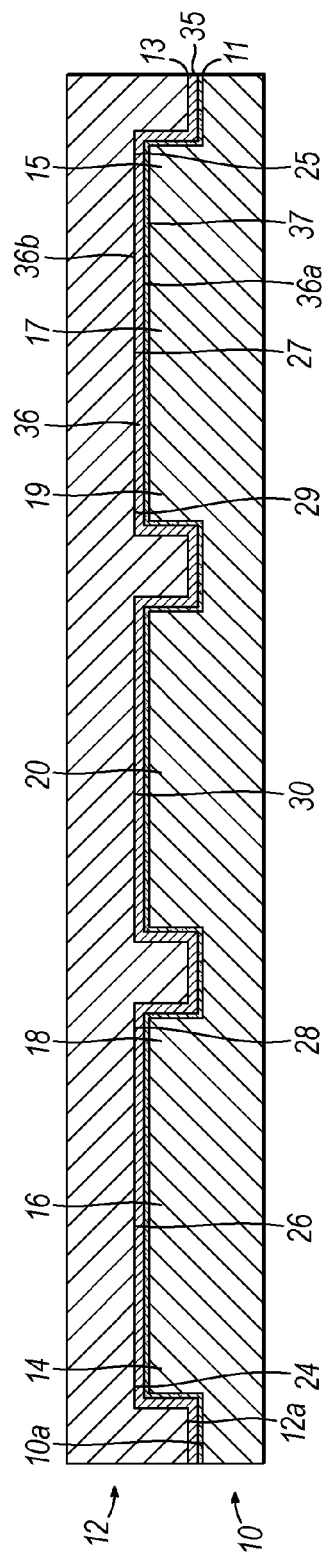
FIG. 4 is a cross-sectional view similar to FIG. 3 in which the molds are pressed together so that the sheet is crimped between the molds.

With reference to FIG. 4 in which like reference numerals refer to like features in FIG. 3 and at a subsequent stage of the process flow, the molds 10, 12 are pressed together with the sheet 36 positioned between mold 10 and mold 12. In one embodiment, mold 10 may be held stationary and mold 12 may be moved relative to mold 10 to provide feature engagement. The forces exerted by the compression of the molds cause the sheet 36, which is ductile and pliable, to plastically deform locally to match the features 14-23 of mold 10. In particular, the sheet 36 is locally displaced relative to the surface 10a by the engagement of the congruent mold features and into the features 14-23 so as to be crimped between the congruent molds 10, 12. The matching is reflected by the conformation of the crimped sheet 36 to the shape, arrangement, and configuration of the features 14-23 of mold 10. When the molds 10, 12 are closed, the surface 10a of mold 10 may be separated from the surface 12a of mold 12 a distance equal to the thickness, t, of the sheet 36. The sheet 36 may conform to the shape of the features 14-23 such that the corners of the features 14-23 are filled by the electrically-conductive material of the sheet 36. Because of the plastic deformation, the sheet 36 is not die cut when the molds 10, 12 are closed.

The crimped shape of sheet 36 conforms to and reproduces the topology of the mold 10 with portions of the sheet 36 captured and molded between the features 14-23 of mold 10 and the features 24-33 of mold 12. The properties of the sheet 36 may be chosen such that portions of its electrically-conductive material occupying the features 14-23 are free of wrinkling or defects introduced by the molding process. When the molds 10, 12 are separated, the sheet 36 is preferentially retained by the layer 37 to the mold 10 and does not peel from mold 10. However, the adhesion with mold 10 provided by layer 37 does not significantly impede the crimping process. Any change to the thickness, t, of the sheet 36 from the crimping process may be negligible.

Figure 5:
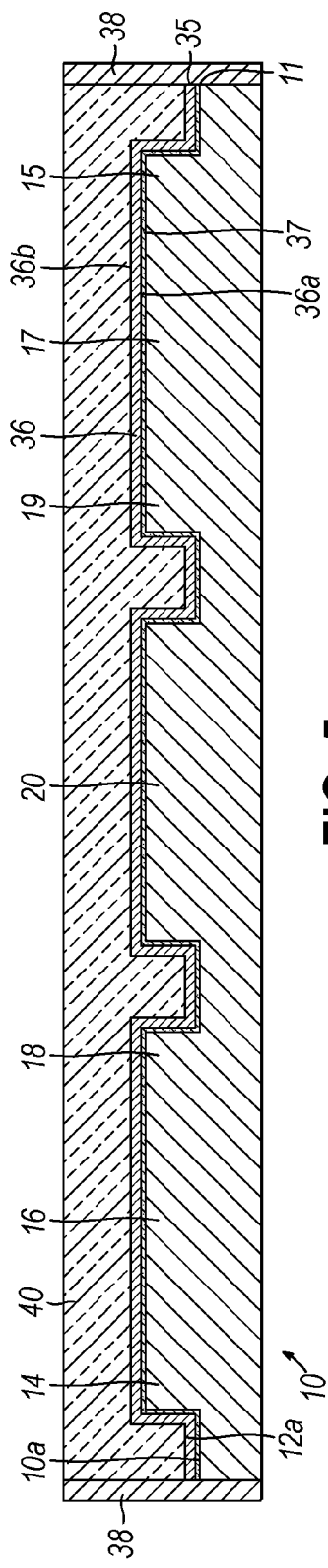
FIG. 5 is a cross-sectional view similar to FIG. 4 in which a substrate is formed using the mold bearing the crimped sheet.

With reference to FIG. 5 in which like reference numerals refer to like features in FIG. 4 and at a subsequent stage of the process flow, a substrate 40 is then formed that supports the crimped sheet 36 and provides mechanical strength by being permanently attached to the thinner sheet 36. The crimped sheet 36 is disposed between the mold 10 and the substrate 40. The mold 12 does not participate in the segment of the process flow forming the substrate 40, which provides the base material for the printed circuit board under fabrication.

A casting process may be used in the formation of the substrate 40. In one embodiment, a gravity casting process may be used to form the substrate 40. To that end, the mold 10 may be oriented with the crimped sheet 36 facing upward to provide an open mold with exposed details, the perimeter 11 of mold 10 may be surrounded with a skirt or dam 38, and a liquid resin material may be supplied to the mold 10. A specific volume of the liquid resin material may be poured into the mold. Alternatively, a resin dispensing system may be utilized to condition and mix the resin material, and to then dispense a metered volume of the resin material with a pump into the mold 10. The substrate 40 may have a selected base material thickness, such as common base material thicknesses like 1/16 inch (1.58 mm) or 1/32 inch (0.79 mm), is linked to the volume of liquid resin material introduced into the mold 12.

The fluid or liquid resin material contacts the crimped sheet 36 and is pulled by gravity to fill the metal-covered features 14-23. The fluid or liquid resin material also overflows the mold features to cover the surface 10a of mold 10 and rise to a given height above the surface 10a dependent on the volume of resin material. Pressure and/or centrifugal force can be applied to assist the pull of gravity by pushing the liquid resin material into all mold features. Any air bubbles in the resin material may be removed in a vacuum chamber or, alternatively, casting may be performed in a vacuum chamber.

The resin material, which is initially in a fluid or liquid state, may be cured to provide a transformation to a solidified state. Energy (e.g., heat, an electron beam, or ultraviolet light) may be applied and/or a catalyst (e.g., curing agent) may be added to the composition of the resin material to provide the liquid-to-solid transformation. In one embodiment, the added energy and/or catalyst may produce irreversible cross-linking that bonds the polymer chains of the resin material. After solidification and before de-molding, the substrate 40 and sheet 36 comprise an assembly in which the sheet 36 is permanently and irreversibly bonded with the substrate 40.

The substrate 40 is comprised of a non-conductive, electrical insulator or dielectric material. The selection of a material for the substrate 40 may also be influenced by factors, such as dielectric constant (i.e., permittivity), loss tangent, moisture absorption, resistivity for low leakage applications, and voltage breakdown for high voltage applications. Mechanical factors, such as flammability, glass transition temperature, thermal conductivity, coefficient of expansion, and flexibility, may also play a role in material selection. The dielectric material may be comprised of a polymer, such as thermosetting plastics like epoxy, a fiberglass-filled epoxy, polyimide, polystyrene, polyimide, polytetrafluoroethylene (PTFE), etc.

Figure 6:
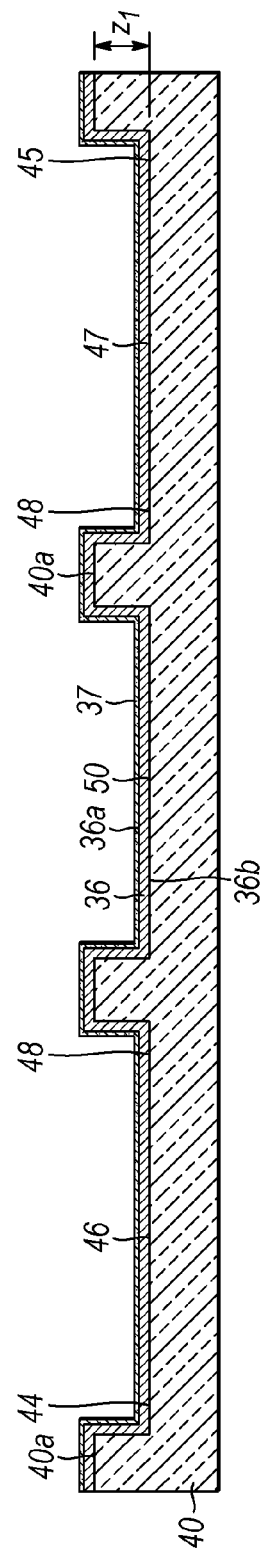
FIG. 6 is a cross-sectional view similar to FIG. 5 in which an assembly comprised of the substrate and the crimped sheet has been removed from the mold.

With reference to FIG. 6 in which like reference numerals refer to like features in FIG. 5 and at a subsequent stage of the process flow, the assembly comprised of the sheet 36 and substrate 40 is extracted or otherwise removed from the mold 10 such that the assembly maintains its integrity as an integral unit. The bonding force between the sheet 36 and substrate 40 is significantly higher than the bonding force supplied by layer 37 between the sheet 36 and mold 10. When the assembly is removed from the mold 10, the sheet 36 is readily released from the mold 10 without either damaging the sheet 36 or peeling the sheet 36 away from the substrate 40. The crimped sheet 36 may be continuous and unbroken so that the surface 40a and features 44-53 of substrate 40 are covered. Residue from layer 37 may be cleaned from sheet 36 by, for example, a solvent rinse or bath.

The substrate 40 includes a surface 40a and a pattern of features, including features 44-53 that are representative of all features of the substrate 40, associated with the surface 40a. The features 44-53 of the substrate 40 correspond to the features 14-23 of the mold 10. More specifically, the features 44-53 are shaped, arranged, and configured as an inverse image reproducing the shape arrangement, and configuration of the features 14-23 of mold 10. At this stage of the process flow, the bottoms of the features 44-53 of substrate 40 may be recessed by a depth $z_1$ measured relative to the surface 40a of substrate 40.

Figure 7:
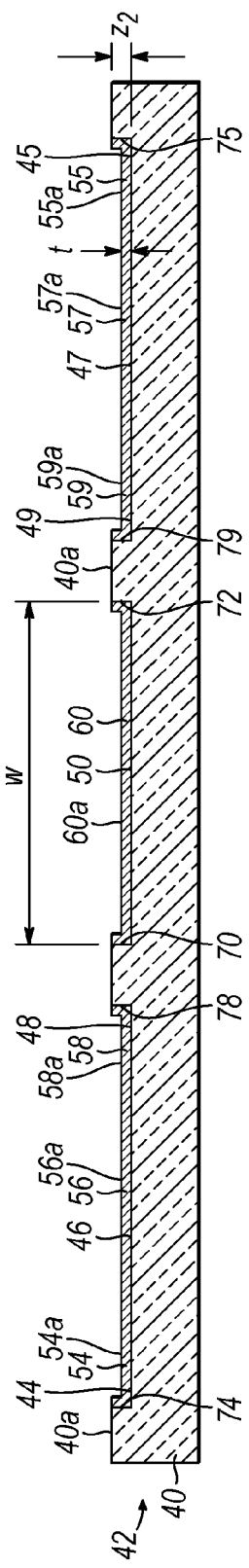
FIG. 7 is a cross-sectional view similar to FIG. 6 in which the assembly has been modified to form a printed circuit board by removing the sheet from raised surfaces of the substrate and leaving portions of the sheet intact as inlaid conductors in recesses of the substrate.
Figure 8:
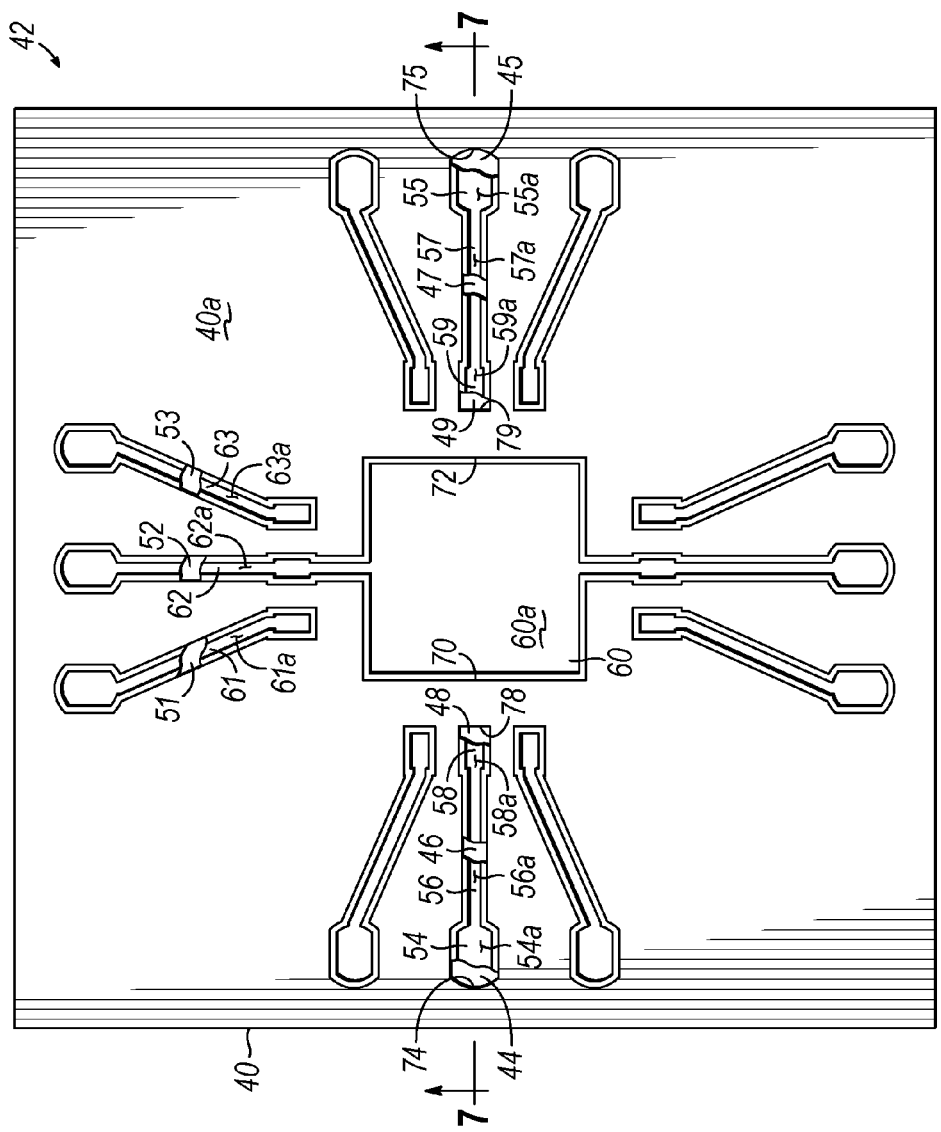

With reference to FIGS. 7 and 8 in which like reference numerals refer to like features in FIG. 6 and at a subsequent stage of the process flow, the raised electrically-conductive material of sheet 36 on the surface 40a of substrate 40 is removed by a mechanical process, such as sanding, grinding, polishing, or combinations thereof. The remaining material of sheet 36, which is permanently bonded with the substrate 40, defines the conductors of the board layout and contributes to forming a component side of the bare printed circuit board 42 to which components will be mounted. In particular, the conductors comprise features 54-63, such as lands, solder pads, power tracks, and signal tracks, of the printed circuit board 42. For the embodiment of the printed circuit board 42 shown in FIG. 1, representative features 56, 57, and 61-63 are tracks or traces in the printed circuit, representative features 54, 55, 58, 59 are solder pads in the printed circuit, and feature 60 is a land in the printed circuit. Other features visible in FIG. 8 represent features that are similar or identical to features 54-63. The features 54-62 may have a thickness equal to the thickness, t, of the sheet 36.

Each of the features 54-63, which are representative of all conductors on the printed circuit board 42, is associated with one of the features 44-53 in substrate 40. In the representative embodiment, the features 44-53 are recesses and each of the features 54-63 is situated in a recess defined by one of the features 44-53 in substrate 40. The conductors embodied by the features 54-63 have a rectangular geometrical shape in cross-section and have sidewalls that are oriented vertical relative to the surface 40a of the substrate 40. For example, sidewalls 70, 72 of the conductor feature 60 are coextensive with the recess of substrate feature 50, including the interior corners thereof, and are perpendicular to the surface 40a. Conductor features 54, 55, 58, 59 have respective sidewalls 74, 76, 78, 79 similar to the sidewalls 70, 72. The conductor features 54-60 do not exhibit an isosceles trapezoidal geometrical shape in cross-section in which the sidewalls are inclined and the conductor width between the sidewalls varies as a function of feature height, which is observed in printed circuit boards fabricated by etching a masked layer of conductive material. Each of the conductors embodied in the features 54-63 has a thickness, a length, and a width that is uniform as a function of height or thickness at any location along its length. In one embodiment, the line widths may be suitable for 0.1 inch grid printed circuit boards and devices.

The printed circuit board 42 may be considered to be single-sided in that only one face includes the conductors of features 54-63 as metallization. The substrate 40 functions as a common base for all of the conductors of the circuit pattern. The printed circuit board 42 provides mechanical support for the metallization embodied in the conductors of features 54-63 and for the components that are subsequently mounted to the printed circuit board 42.

In addition to removing portions of sheet 36 from the surface 40a, the same or a different mechanical process may be used to remove the material of the substrate 40 so that the separation between the surface 40a and the top surfaces 54a-63a of the conductor features 54-63 is reduced. As a result, the depth of the features 44-53 of substrate 40 relative to the surface 40a is reduced from the original depth $z_1$ to a shallower depth $z_2$. The removal of the surface 40a may be limited to avoid damaging the features 54-63 comprising the conductors of the printed circuit board 42. The depth $z_2$ may be greater than the thickness of the conductors embodied in features 54-63 and/or the thickness of the sheet 36 so that the surface 40a of substrate 40 in the completed printed circuit board 42 is in a plane that is raised or elevated above a plane containing the surfaces 54a-63a of the features 54-63.

Additional processing may follow to create a printed circuit board assembly. A numeric control drill machine may be used to drill holes in the printed circuit board 42. The holes may have locations coinciding with the locations of solder pads and may be used, for example, to provide component attachment and electrical connections to the printed circuit board 42 or to provide vias extending into and through the printed circuit board 42. Some or all of the holes may be plated with conductor. A solder mask may be applied to the entire printed circuit board 42 with the exception of solder pads. The solder mask may comprise a thin polymer layer that is patterned to define openings at the locations of solder pads. During the soldering process, the solder mask prevents solder bridges from forming between closely spaced solder pads. In the finished board assembly, the solder mask may provide protection against oxidation by covering oxidation-sensitive conductors.

An oxidation resistant material, such as gold, tin or tin-lead, may be applied to the exposed surfaces of some or all of the conductors embodied in features 54-63. Components may be surface-mounted or through-hole mounted onto the surface of the printed circuit board 42 to populate the printed circuit board 42 and provide the printed circuit board assembly. Wave soldering may be used to attach the components by surface mounting or through-hole mounting. Lettering and markings may be applied to the printed circuit board 42 using a silk screen printing process. The perimeter of the printed circuit board 42 may be cut to shape using a router bit to provide a form factor that fits the chassis, system, or physical environment into which the printed circuit board 42 is eventually put into service.

The printed circuit board 42 may be mass produced with a reduced environmental impact in comparison with conventional manufacturing processes. In accordance with the various embodiments of the invention, the conductors of the printed circuit board 42 are fabricated without the use of etching or photolithography. A mechanical crimping of the sheet 36 on the features of the mold 10 replaces the photolithography process needed conventionally to create an image ready for chemical etching. A mechanical reduction of the raised sections of the crimped sheet 36 on the substrate 40 to define the conductors replaces the etching process used conventionally to define the conductors. These substitutions may eliminate processes that produce pollutants that are potentially harmful to the environment and, thereby, eliminate several solid and liquid waste streams from the board manufacturing process.

The elimination of etching and photolithography may reduce the quantity of liquid chemical waste, including spent etchants (containing high concentrations of metal), dry film developer, resist strip, and spent solvent, needed to fabricate a printed circuit board. Solid wastes attributable to liquid chemical usage may also be reduced. The elimination of etching and photolithography may also reduce the generation of rinse water contaminated with metals and/or solvents. The etching and photolithography processes involve a series of chemical baths. Rising stages are used to terminate chemical reactions and to prevent subsequent chemical baths from becoming contaminated. As a result, large quantities of water may be used during conventional board manufacture making this a significant environmental impact of the process. In addition, atmospheric emissions from etchant solutions and solvents may be reduced as these volatile materials are not required to define the conductors of the printed circuit board.

Beyond minimizing the environmental impact of board manufacture, the elimination of etching and photolithography may have other positive effects on the printed circuit board industry. In particular, the manufacturing cost may be reduced. For example, the absence of etching and photolithography processes may eliminate the need to purchase capital equipment to perform these processes and related processes. The eliminated capital equipment will no longer incur a cost of ownership for its operation. In addition, expenditures for process chemicals and other consumable materials will be reduced by the elimination of etching and photolithography from the processes forming and defining the conductors of the printed circuit board.

Because the conductor features of the printed circuit board of the various embodiments of the invention are formed without the use of an etchant in accordance with the various embodiments of the invention, artifacts of the etching process may be eliminated. For example, the conductor features do not exhibit the characteristic shape of an isosceles trapezoid produced by lateral undercut of the conductor beneath the etch mask during etching. Instead of a profile in which the conductor width varies as a function of height as observed for an isosceles trapezoid, the conductors formed with by crimping exhibit a width that is uniform of constant with position along the conductor length relative to the conductor height or thickness and sidewalls that are contained in planes perpendicular to the top surface of the substrate.

With reference to FIG. 9, an apparatus 100 for designing and producing the molds 10, 12 may be implemented on one or more computing devices or systems, such as exemplary computer 102. For the purposes of the invention, computer 102 may represent practically any type of computer, computer system or other programmable electronic device. Moreover, computer 102 may be implemented using one or more networked computers, e.g., in a cluster or other distributed computing system, or may be implemented within a single computer or other programmable electronic device, e.g., a desktop computer, laptop computer, handheld computer, etc.

Computer 102 typically includes at least one processor or central processing unit 104 capable of manipulating signals (analog or digital) based on instructions that are stored in a memory 106. Memory 106 may include a single memory device or a plurality of memory devices including, but not limited to, read-only memory (ROM), random access memory (RAM), volatile memory, non-volatile memory, static random access memory (SRAM), dynamic random access memory (DRAM), flash memory, or any other device capable of storing digital information. In addition, memory 106 may be considered to include memory storage physically located elsewhere in computer 102, e.g., any cache memory in a processor in central processing unit 104, as well as any storage capacity used as a virtual memory, e.g., as stored on a mass storage device 108 or on another computer coupled to computer 102. For additional storage, computer 102 may also include one or more mass storage devices 108, e.g., a hard drive, optical drive, tape drive, non-volatile solid state device, or any other device capable of storing digital information.

Central processing unit 104 may operate under the control of an operating system 110 that resides in memory 106. The operating system 110 may manage computer resources so that computer program code, which is embodied as one or more computer software applications 112 residing in memory 106, may have instructions executed by the central processing unit 104. One or more data structures 116 may also reside in memory 106, and may be used by the central processing unit 104, operating system 110, and/or applications 112 to store or manipulate data.

The computer 102 may include an I/O interface 118 that supplies a machine interface that operatively couples the central processing unit 104 with other devices and systems, such as a manufacturing tool 120 and/or a network (e.g., a LAN, a WAN, a wireless network, and/or the Internet, among others). The applications 112, 114 may thereby work cooperatively with the manufacturing tool 120 by communicating via the I/O interface 118 in the production of the molds 10, 12.

The computer 102 may include a user interface 122 that may be operatively coupled to the central processing unit 104 to permit a user to interact with the computer 102. The user interface 122 may include output devices, such as a display, a touch screen, a speaker, etc. The user interface 122 may also include input devices and controls, such as an alphanumeric keyboard, a pointing device, a keypad, a microphone, etc., capable of accepting input from the user and transmitting the entered input to the central processing unit 104.

A board designer may create an electronic diagram or schematic of a circuit for a printed circuit board by schematic capture or entry using electronic design automation (EDA) or computer-aided design (CAD) layout software executing as one of the applications 112 on the central processing unit 104 of computer 102. The designer may interactively produce the schematic with the assistance of a schematic capture tool or editor incorporated into the CAD layout software. The schematic graphically shows the electrical connections, components, and functions of a specific circuit arrangement. The schematic may be a data file that is stored as one of the data structures 116 in memory 106. Upon capturing the schematic, the designer may utilize a simulation tool (e.g., a SPICE or XSPICE simulation) of the CAD layout software to predict the behavior of the circuit and analyze the effects of various components and signals upon the design.

Using the CAD layout software executing as an application 112 on the central processing unit 104 of computer 102, the designer may interactively construct a layout of the components and conductors for the printed circuit board based upon the circuit design captured in the electronic schematic. As part of the layout process, the form factor for the board outline may be chosen, component locations on the board may be chosen, conductor thickness and track width may be determined, the locations of lands and solder pads may be chosen, and tracks may be routed. The sizes, shapes, and dimensions of signal pads may be selected dependent upon, among other factors, the type of component. Track routing may take standards and manufacturing capabilities into consideration. Among the parameters that may be specified as design rules for the conductor layout include, but are not limited to, minimum conductor width, edge-to-edge minimum conductor spacing from, minimum pad-to-pad spacing, minimum conductor-to-pad spacing, and minimum conductor-to-board edge distance. One or more of these parameters may be selected based upon line impedance determinations.

The CAD layout software may output a layout data file, such as a file exported in a Gerber format (i.e., a Gerber file) or another industry standard format, that includes data representing the layout of the conductors. The Gerber file may be stored as one of the data structures 116 in memory 106. The CAD layout software may also output an additional file that is used by a numeric control drill machine to drill holes of exact sizes at exact locations on the printed circuit board. Hole locations and sizes may be specified by the designer during the layout process. Additional data files generated by the CAD layout software may include layers for the solder mask and silk screening.

The layout data for the conductors in the layout data file may be converted into production data of a format suitable for loading into the manufacturing tool 120. The conversion may be provided by computer-aided manufacturing (CAM) software executed by the central processing unit 104 of computer 102 as one of the applications 112. The production data may be stored as a file in another of the data structures 116 in memory 106. The complementary layout for mold 12 may be determined using the CAM software from the production data for mold 10. Alternatively, the complementary layout for mold 12 may be derived from the layout data for mold 10 using the CAD layout software and supplied for conversion to production data. A dimensional tolerance may be introduced into the complementary features of mold 12 relative to the features of mold 10 that accounts for the thickness of the sheet 36 during the crimping process. The CAD-to-CAM data exchange may identify and repair any irregularities and inconsistencies in the layout data file that may have been introduced during the design phase.

The CAM software may be used to control the operation of the manufacturing tool 120 for producing the molds 10, 12 based upon the production data. In one embodiment, the manufacturing tool 120 may be a three-dimensional printer capable of producing three-dimensional solid objects having the shape of the molds 10, 12. Three-dimensional printing is an additive process in which successive layers of material are laid down in different shapes under the control of the CAM software and based upon the product data to fabricate the molds 10, 12.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a printed circuit board, the method comprising:
    obtaining a first mold including a plurality of features that correspond to a layout of a plurality of conductors for the printed circuit board;
    deforming a sheet comprised of an electrically-conductive material to match the features of the first mold;
    after the sheet is deformed, forming a substrate that is coupled with the sheet; and
    removing the substrate and the sheet as an assembly from the first mold.

2. The method of claim 1 wherein the substrate includes a surface and a plurality of recesses in the surface, and the sheet occupies the recesses and covers the surface, and further comprising:
    mechanically removing the electrically-conductive material of the sheet from the surface of the substrate to define the conductors in the recesses.

3. The method of claim 2 further comprising:
    after the electrically-conductive material of the sheet is mechanically removed from the surface of the substrate, mechanically removing the surface of the substrate to reduce a depth of the recesses relative to the surface of the substrate.

4. The method of claim 3 wherein the depth of the recesses is greater than or equal to a thickness of the sheet.

5. The method of claim 1 wherein forming the substrate that is coupled to the sheet comprises:
    applying a liquid resin material in contact with the sheet; and
    curing the liquid resin material to form the substrate.

6. The method of claim 1 further comprising:
obtaining a second mold having a plurality of features corresponding in configuration, shape, and arrangement to the features of the first mold.

7. The method of claim 6 wherein deforming the sheet comprised of the electrically-conductive material to match the features of the first mold comprises:
placing the sheet between the first mold and the second mold; and
pressing the second mold against the first mold so that the features of the second mold engage the features of the first mold with the sheet therebetween and the sheet is deformed by the features of the second mold into the features of the first mold.

8. The method of claim 7 further comprising:
before the first mold and the second mold are pressed together, temporarily bonding the sheet to the first mold with an adhesive agent effective to retain the sheet to the first mold when the second mold is separated from the first mold.

9. The method of claim 2 wherein the electrically-conductive material of the sheet is mechanically removed from the surface of the substrate by a mechanical process comprising as sanding, grinding, polishing, or combinations thereof.

10. A method of fabricating a printed circuit board, the method comprising:
obtaining a first mold including a plurality of features that correspond to a layout of a plurality of conductors for the printed circuit board;
obtaining a second mold having a plurality of features corresponding in configuration, shape, and arrangement to the features of the first mold; and
deforming a sheet comprised of an electrically-conductive material to match the features of the first mold,
wherein deforming the sheet comprised of the electrically-conductive material to match the features of the first mold comprises:
placing the sheet between the first mold and the second mold; and
pressing the second mold against the first mold so that the features of the second mold engage the features of the first mold with the sheet therebetween and the sheet is deformed by the features of the second mold into the features of the first mold.

11. The method of claim 10 further comprising:
before the first mold and the second mold are pressed together, temporarily bonding the sheet to the first mold with an adhesive agent effective to retain the sheet to the first mold when the second mold is separated from the first mold.

12. The method of claim 10 wherein the substrate includes a surface and a plurality of recesses in the surface, and the sheet occupies the recesses and covers the surface, and further comprising:
mechanically removing the electrically-conductive material of the sheet from the surface of the substrate to define the conductors in the recesses.

13. The method of claim 12 further comprising:
after the electrically-conductive material of the sheet is mechanically removed from the surface of the substrate, mechanically removing the surface of the substrate to reduce a depth of the recesses relative to the surface of the substrate.

14. The method of claim 13 wherein the depth of the recesses is greater than or equal to a thickness of the sheet.

15. The method of claim 10 further comprising:
after the sheet is deformed, applying a liquid resin material in contact with the sheet; and
curing the liquid resin material to form a substrate couple to the sheet.

* * * * *